US008611097B2

(12) United States Patent
Yin et al.

(10) Patent No.: US 8,611,097 B2
(45) Date of Patent: *Dec. 17, 2013

(54) SERIAL ADVANCED TECHNOLOGY ATTACHMENT DUAL IN-LINE MEMORY MODULE ASSEMBLY

(75) Inventors: Xiao-Gang Yin, Shenzhen (CN); Wei-Min He, Shenzhen (CN); Guo-Yi Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 220 days.

This patent is subject to a terminal disclaimer.

(21) Appl. No.: 13/339,407

(22) Filed: Dec. 29, 2011

(65) Prior Publication Data

US 2013/0151745 A1    Jun. 13, 2013

(30) Foreign Application Priority Data

Dec. 9, 2011    (CN) .......................... 2011 1 0408514

(51) Int. Cl.
*H05K 1/00* (2006.01)
*H05K 1/11* (2006.01)

(52) U.S. Cl.
USPC ...... 361/753; 361/803; 361/791; 361/679.31; 439/62

(58) Field of Classification Search
USPC ..................... 361/784–795; 439/62; 710/301
See application file for complete search history.

(56) References Cited

U.S. PATENT DOCUMENTS

| 5,611,057 | A  | * | 3/1997 | Pecone et al. | 710/301 |
| 6,004,139 | A  | * | 12/1999 | Dramstad et al. | 439/59 |
| 6,449,676 | B1 | * | 9/2002 | Johari et al. | 710/304 |
| 6,491,526 | B2 | * | 12/2002 | Leman | 439/61 |
| 6,639,806 | B1 | * | 10/2003 | Chuang et al. | 361/748 |
| 7,255,570 | B1 | * | 8/2007 | Feldman et al. | 439/64 |
| 7,473,100 | B2 | * | 1/2009 | Moritake | 439/62 |
| 8,423,695 | B2 | * | 4/2013 | Purwin | 710/301 |
| 2002/0072255 | A1 | * | 6/2002 | Leman | 439/61 |
| 2002/0141170 | A1 | * | 10/2002 | Rhoads | 361/796 |
| 2003/0007339 | A1 | * | 1/2003 | Harris et al. | 361/788 |
| 2006/0080473 | A1 | * | 4/2006 | Wang et al. | 710/7 |
| 2006/0245119 | A1 | * | 11/2006 | Goodwin et al. | 361/1 |
| 2008/0065805 | A1 | * | 3/2008 | Wu et al. | 710/301 |
| 2008/0094811 | A1 | * | 4/2008 | Hazelzet | 361/760 |
| 2009/0075494 | A1 | * | 3/2009 | Crighton | 439/62 |
| 2010/0128447 | A1 | * | 5/2010 | MacDougall et al. | 361/737 |
| 2010/0241799 | A1 | * | 9/2010 | Schuette | 711/104 |

(Continued)

*Primary Examiner* — Adrian S Wilson
*Assistant Examiner* — Abhishek Rathod
(74) *Attorney, Agent, or Firm* — Altis Law Group, Inc.

(57) ABSTRACT

A serial advanced technology attachment dual-in-line memory module (SATA DIMM) assembly includes a SATA DIMM module with a first circuit board, an expansion slot, and an expansion card with a second circuit board. A first edge connector is arranged on a bottom edge of the first circuit board and includes first power pins connected to a control chip and first storage chips, and first ground pins. A second edge connector connected to the expansion slot is arranged on a top edge of the first circuit board and includes second power pins connected to the first power pins, second ground pins, and four first signal pins connected to the control chip. A third edge connector engaged in the expansion slot is arranged on a bottom edge of the second circuit board and includes third power pins and four second signal pins connected to the second storage chips, and third ground pins.

5 Claims, 2 Drawing Sheets

(56) References Cited

U.S. PATENT DOCUMENTS

| | | | |
|---|---|---|---|
| 2011/0159718 A1* | 6/2011 | McKee | 439/326 |
| 2012/0299582 A1* | 11/2012 | Bai et al. | 324/123 R |
| 2012/0320551 A1* | 12/2012 | Sun | 361/785 |
| 2013/0038999 A1* | 2/2013 | Tian et al. | 361/679.41 |
| 2013/0070412 A1* | 3/2013 | Ge et al. | 361/679.32 |
| 2013/0073768 A1* | 3/2013 | Cong et al. | 710/301 |
| 2013/0094167 A1* | 4/2013 | Chen et al. | 361/791 |
| 2013/0100627 A1* | 4/2013 | Cong et al. | 361/785 |
| 2013/0114200 A1* | 5/2013 | Wu et al. | 361/679.31 |
| 2013/0151745 A1* | 6/2013 | Yin et al. | 710/301 |
| 2013/0155601 A1* | 6/2013 | Tian | 361/679.31 |
| 2013/0155637 A1* | 6/2013 | Yin et al. | 361/791 |
| 2013/0164952 A1* | 6/2013 | Wu et al. | 439/62 |
| 2013/0170128 A1* | 7/2013 | Liu et al. | 361/679.32 |

* cited by examiner

SERIAL ADVANCED TECHNOLOGY ATTACHMENT DUAL IN-LINE MEMORY MODULE ASSEMBLY

CROSS-REFERENCE OF RELATED APPLICATION

Relevant subject matter is disclosed in two co-pending U.S. patent application Ser. Nos. 13/339,409 and 13/339,419 filed on the same date, and respectively having titles of "SERIAL ADVANCED TECHNOLOGY ATTACHMENT DUAL IN-LINE MEMORY MODULE ASSEMBLY" and "DISPLAY CARD ASSEMBLY", which are assigned to the same assignee as this patent application.

BACKGROUND

1. Technical Field

The present disclosure relates to a serial advanced technology attachment dual in-line memory module (SATA DIMM) assembly.

2. Description of Related Art

Solid state drives (SSD) store data on chips instead of on magnetic or optical discs. One type of SSD has the form factor of a DIMM module and it is called a SATA DIMM module. The SATA DIMM module can be inserted into a memory slot of a motherboard, to add storage capacity. Generally, a SATA DIMM module includes a plurality of storage chips and a storage controller for controlling the storage chips to store data. The problem is that the number of the storage chips arranged on the SATA DIMM module is limited and it is difficult to add additional storage capacity.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the drawings, is illustrated by way of example and not by way of limitation. References to "an" or "one" embodiment in this disclosure are not necessarily to the same embodiment, and such references mean at least one.

Figure 1:
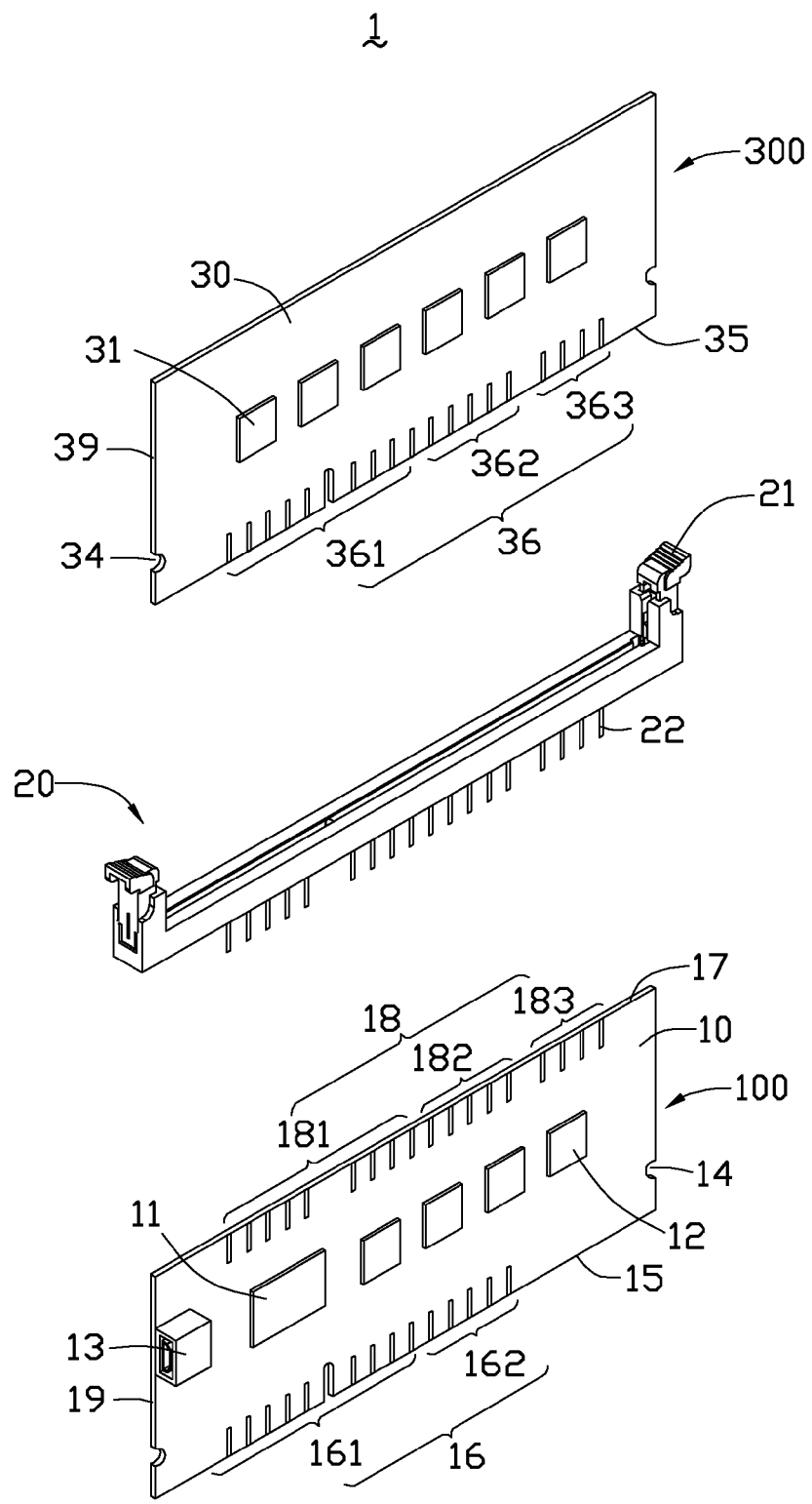
FIG. 1 is an exploded, isometric view of a serial advanced technology attachment dual in-line memory module (SATA DIMM) assembly in accordance with an exemplary embodiment of the present disclosure.
Figure 2:
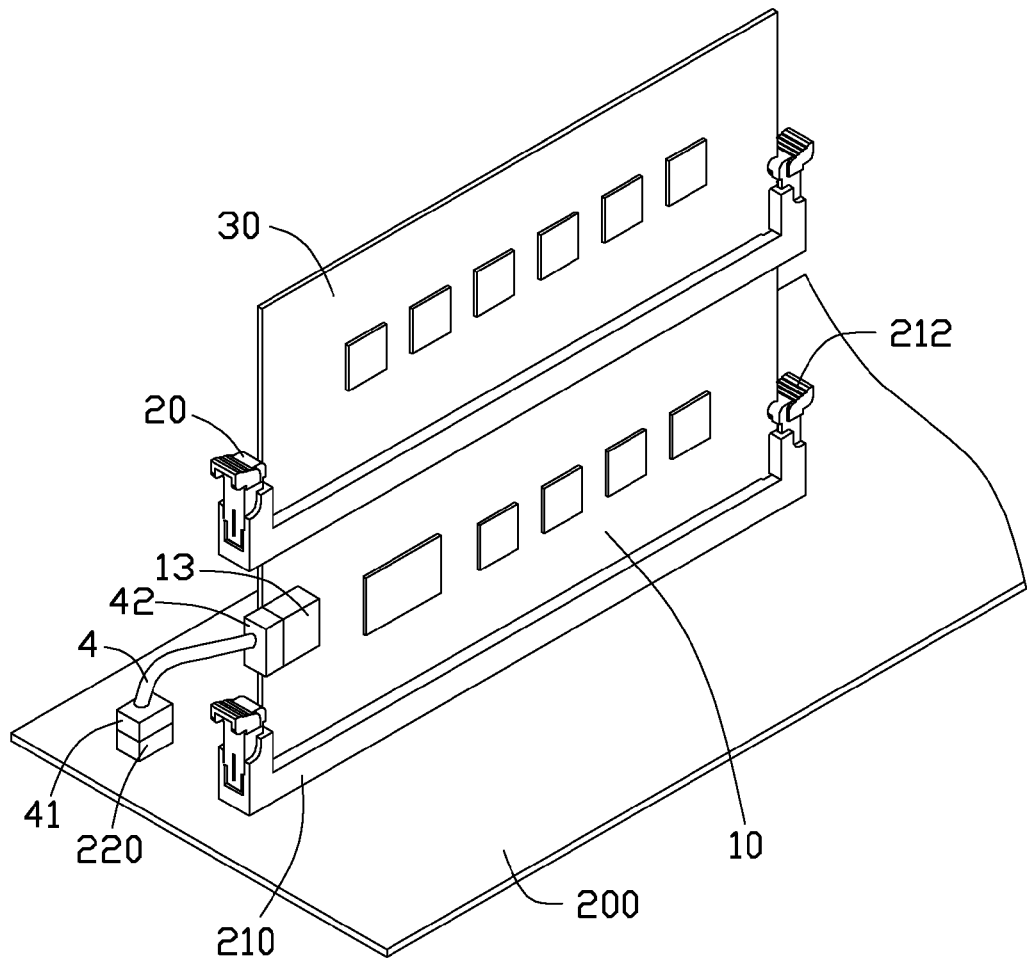
FIG. 2 is an assembled, isometric view of the SATA DIMM module assembly of FIG. 1 connected to a motherboard.

FIGS. 1 and 2, are a serial advanced technology attachment dual in-line memory module (SATA DIMM) assembly 1 in accordance with an exemplary embodiment including a SATA DIMM module 100, an expansion slot 20, and an expansion card 300. In one embodiment, the expansion slot 20 is a double data rate type three (DDR3) memory slot.

The module 100 includes a substantially rectangular circuit board 10. A control chip 11, a plurality of storage chips 12, and a storage device interface 13 are all arranged on the circuit board 10. The storage device interface 13 is arranged on an upper left corner of the circuit board 10 and adjacent to an end 19 of the circuit board 10. The control chip 11 is connected to the storage device interface 13 and the storage chips 12, to receive a control signal through the storage device interface 13 and control the storage chips 12 to store data according to the control signal. In one embodiment, the storage device interface 13 is a SATA connector. In other embodiments, the storage device interface 13 may be an edge connector and in accordance with SATA standard, and includes a pair of signal input pins, a pair of signal output pins, and three ground pins.

An edge connector 16 is arranged on a bottom edge 15 of the circuit board 10, to be inserted into an expansion slot, such as a DDR3 memory slot 210, of a motherboard 200. The edge connector 16 includes a plurality of power pins 161 and a plurality of ground pins 162. The power pins 161 are connected to the control chip 11 and the storage chips 12. The ground pins 162 are connected to a ground layer (not shown) of the circuit board 10. Two grooves 14 are defined in two opposite ends 19 of the circuit board 10.

An edge connector 18 is arranged on a top edge 17 of the circuit board 10, to be electrically connected to pins 22 of the expansion slot 20. The edge connector 18 includes a plurality of power pins 181, a plurality of ground pins 182, and four signal pins 183. The signal pins 183 include a pair of signal input pins and a pair of signal output pins. The power pins 181 are connected to the power pins 161. The ground pins 182 are connected to a ground layer (not shown) of the circuit board 10. The signal pins 183 are connected to the control chip 11. The storage device interface 13 is arranged below the edge connector 18, to avoid interference with the expansion slot 20 when the edge connector 18 is connected to the expansion slot 20.

The expansion card 30 includes a substantially rectangular circuit board 30. A plurality of storage chips 31 is arranged on the circuit board 30. An edge connector 36 is arranged on a bottom edge 35 of the circuit board 30, to be inserted into the expansion slot 20. The edge connector 36 includes a plurality of power pins 361, a plurality of ground pins 362, and four signal pins 363. The signal pins 363 include a pair of signal input pins and a pair of signal output pins. The power pins 361 and the signal pins 363 are connected to the storage chips 31. The ground pins 362 are connected to a ground layer (not shown) of the circuit board 30. Two grooves 34 are defined in two opposite ends 39 of the circuit board 30.

In assembly, the edge connector 16 is inserted into the memory slot 210. Two fixing elements 212 of the memory slot 210 are respectively engaged in the grooves 14. The storage device interface 13 is connected to a storage device interface 220 of the motherboard 200 by two connectors 41 and 42 of a cable 4. When the motherboard 200 needs to add storage capacity, the edge connector 36 is inserted into the expansion slot 20. The pins 22 are soldered on the circuit board 10, and are connected to the edge connector 18. The power pins 361, the ground pins 362, and the signal pins 363 are respectively connected to the power pins 181, the ground pins 182, and the signal pins 183 through the pins 22. Two fixing elements 21 of the expansion slot 20 are engaged in the grooves 34 of the expansion card 300.

When the motherboard 200 receives power, the motherboard 200 outputs a voltage to the control chip 11 and the storage chips 12 through the memory slot 210 and the power pins 161. At the same time, the voltage output from the motherboard 200 is provided to the storage chips 31 through the power pins 181, the expansion slot 20, and the power pins 361. The motherboard 200 outputs a control signal, such as a SATA signal to the control chip 11 through the storage device interface 220, the cable 4, and the storage device interface 13. The control chip 11 controls the storage chips 12 to store data, and also controls the storage chips 31 to store data through the signal pins 183, the expansion slot 20, and the signal pins 363.

The SATA DIMM assembly 1 can add the storage capacity of the motherboard 200 through the SATA DIMM 100, the expansion card 300, and the expansion slot 20, to save cost.

Even though numerous characteristics and advantages of the disclosure have been set forth in the foregoing description, together with details of the structure and function of the disclosure, the disclosure is illustrative only, and changes may be made in detail, especially in matters of shape, size, and the arrangement of parts within the principles of the disclosure to the full extent indicated by the broad general meaning of the terms in which the appended claims are expressed.

What is claimed is:

1. A serial advanced technology attachment dual-in-line memory module (SATA DIMM) assembly, comprising:
    an expansion slot;
    a SATA DIMM module comprising:
        a first circuit board comprising:
            a plurality of first storage chips;
            a first storage device interface to be connected to a second storage device interface of a motherboard;
            a control chip connected to the first storage chips and the first storage device interface, to receive a control signal through the first storage device interface and control the first storage chips to store data according to the received control signal;
            a first edge connector set on a bottom edge of the first circuit board to engage in a memory slot of the motherboard, the first edge connector comprising a plurality of first power pins connected to the control chip and the first storage chips, and a plurality of first ground pins; and
        a second edge connector arranged on a top edge of the first circuit board and electrically connected to the expansion slot, the second edge connector comprising a plurality of second power pins connected to the first power pins, a plurality of second ground pins, and four first signal pins connected to the control chip; and
    an expansion card comprising:
        a second circuit board comprising:
            a plurality of second storage chips; and
            a third edge connector arranged on a bottom edge of the second circuit board and engaged in the expansion slot, the third edge connector comprising a plurality of third power pins, a plurality of third ground pins, and four second signal pins, wherein the third power pins and the second signal pins are connected to the second storage chips.

2. The SATA DIMM assembly of claim 1, wherein the second edge connector is soldered to the expansion slot.

3. The SATA DIMM assembly of claim 1, wherein the first storage device interface is a SATA connector.

4. The SATA DIMM assembly of claim 1, wherein the first signal pins and the second signal pins each comprise a pair of signal input pins and a pair of signal output pins.

5. The SATA DIMM assembly of claim 1, wherein the first storage device interface is an edge connector and accords with SATA standard, and comprises a pair of signal input pins, a pair of signal output pins, and three ground pins.

* * * * *